United States Patent
Kim et al.

(10) Patent No.: US 8,654,595 B2
(45) Date of Patent: Feb. 18, 2014

(54) NONVOLATILE MEMORY DEVICE WITH A CLAMPING VOLTAGE GENERATION CIRCUIT FOR COMPENSATING THE VARIATIONS IN MEMORY CELL PARAMETERS

(75) Inventors: Chan-Kyung Kim, Hwaseong-Si (KR); Hong-Sun Hwang, Suwon-Si (KR); Chul-Woo Park, Yongin-Si (KR); Sang-Beom Kang, Hwaseong-Si (KR); Hyung-Rok Oh, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/604,688

(22) Filed: Sep. 6, 2012

(65) Prior Publication Data

US 2013/0064008 A1    Mar. 14, 2013

(30) Foreign Application Priority Data

Sep. 8, 2011 (KR) .......................... 10-2011-0091317

(51) Int. Cl.
   *G11C 7/02*    (2006.01)
(52) U.S. Cl.
   USPC . 365/189.15; 365/148; 365/158; 365/189.11; 365/210.11; 365/210.1; 365/207

(58) Field of Classification Search
   USPC .................... 365/148, 158, 173, 171, 189.15, 365/189.09, 189.11, 210.11, 210.1, 207
   See application file for complete search history.

(56) References Cited

U.S. PATENT DOCUMENTS

| | | | | |
|---|---|---|---|---|
| 5,267,203 A | * | 11/1993 | Hwang et al. | 365/190 |
| 6,075,736 A | * | 6/2000 | Kim et al. | 365/207 |
| 6,996,018 B2 | * | 2/2006 | Yun | 365/205 |
| 2009/0265678 A1 | | 10/2009 | Jung et al. | |
| 2009/0323403 A1 | | 12/2009 | Chen et al. | |

FOREIGN PATENT DOCUMENTS

| | | |
|---|---|---|
| JP | 2009-301668 | 12/2009 |
| KR | 1020040029827 A | 4/2004 |

* cited by examiner

*Primary Examiner* — Andrew Q Tran
(74) *Attorney, Agent, or Firm* — Volentine & Whitt, PLLC

(57) ABSTRACT

A nonvolatile memory device comprises a nonvolatile cell array comprising a memory cell and a reference cell, a clamping circuit electrically connected to the memory cell and configured to clamp a voltage applied to a data sensing line during a read operation, and a clamping voltage generation unit configured to generate a clamping voltage responsive to a first voltage having a level based on the reference cell, and to feed back the clamping voltage to the clamping circuit.

20 Claims, 15 Drawing Sheets

NONVOLATILE MEMORY DEVICE WITH A CLAMPING VOLTAGE GENERATION CIRCUIT FOR COMPENSATING THE VARIATIONS IN MEMORY CELL PARAMETERS

CROSS-REFERENCE TO RELATED APPLICATIONS

This application claims priority under 35 U.S.C. §119 to Korean Patent Application No. 10-2011-0091317 filed on Sep. 8, 2011, the disclosure of which is hereby incorporated by reference in its entirety.

BACKGROUND OF THE INVENTION

The inventive concept relates generally to electronic memory technologies. More particularly, the inventive concept relates to a data read circuit, a nonvolatile memory device comprising the data read circuit, and a method of reading data from the nonvolatile memory device.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM). Examples of nonvolatile memory devices include phase change random access memory (PRAM), resistive random access memory (RRAM), magnetic random access memory (MRAM), and ferroelectric random access memory (FRAM).

Researchers are continually seeking to improve various aspects of volatile and nonvolatile memory devices, such as integration density, operating speed, and reliability. However, as improvements are made to one aspect of a memory device, other aspects may be degraded. For instance, as operating speed is increased, reliability may decrease. Accordingly, there is a general need for new techniques to improve various memory characteristics concurrently.

SUMMARY OF THE INVENTION

According to an embodiment of the inventive concept, a nonvolatile memory device comprises a nonvolatile cell array comprising a memory cell and a reference cell, a clamping circuit electrically connected to the memory cell and configured to clamp a voltage applied to a data sensing line during a read operation, and a clamping voltage generation unit configured to generate a clamping voltage responsive to a first voltage having a level based on the reference cell, and to feed back the clamping voltage to the clamping circuit.

According to another embodiment of the inventive concept, a data read circuit for a nonvolatile memory device comprises a memory cell read circuit comprising a first clamping circuit electrically connected to a memory cell and configured to clamp a data voltage applied to a data sensing line, a reference cell read circuit comprising a second clamping circuit and a third clamping circuit electrically connected to a first reference cell and a second reference cell, respectively, the second and third clamping circuits configured to respectively clamp a first reference voltage applied to a first transfer line and a second reference voltage applied to a second transfer line, and a clamping voltage generation unit configured to generate a clamping voltage to vary according to the first and second reference voltages, wherein the clamping voltage is fed back to at least one of the first to third clamping circuits.

According to another embodiment of the inventive concept, a method of reading data from a nonvolatile memory device comprises adjusting a clamping voltage based on a reference voltage generated by performing a read operation on a reference cell, adjusting a data voltage of a data sensing line connected to a memory cell according to the clamping voltage, and performing the read operation on the memory cell.

These and other embodiments of the inventive concept can potentially improve the reliability of read operations performed in nonvolatile memory devices such as MRAMs, for example.

BRIEF DESCRIPTION OF THE DRAWINGS

The drawings illustrate selected embodiments of the inventive concept. In the drawings, like reference numbers indicate like features.

DETAILED DESCRIPTION

Selected embodiments of the inventive concept are described below with reference to the accompanying drawings. These embodiments are presented as teaching examples and should not be construed to limit the scope of the inventive concept.

The described embodiments relate generally to nonvolatile memory devices and ways of improving their performance and/or reliability. For example, one way to improve the reliability of a nonvolatile memory device is by reducing variations in the operation of its memory cells. These variations can be produced by various factors, such as differences in cell resistance values (e.g., in an RRAM), or fluctuations of a bias current, a current source, or a bit line resistance. These variations may also occur due to changes to an external reference voltage applied globally to a memory region.

Certain embodiments are described with reference to an MRAM that stores data using a change in a resistance value of a magnetic tunneling junction (MTJ) cell. The resistance value of the MTJ cell varies according to a direction in which a free layer is magnetized. For example, the resistance value of the MTJ cell is low when the magnetization direction of the free layer is the same as that of a fixed layer and is high when the magnetization direction of the free layer is different from that of the fixed layer. Data '0' is stored when the resistance value of the MTJ cell is low and data '1' is stored when the resistance value of the MTJ cell is high.

Figure 1:
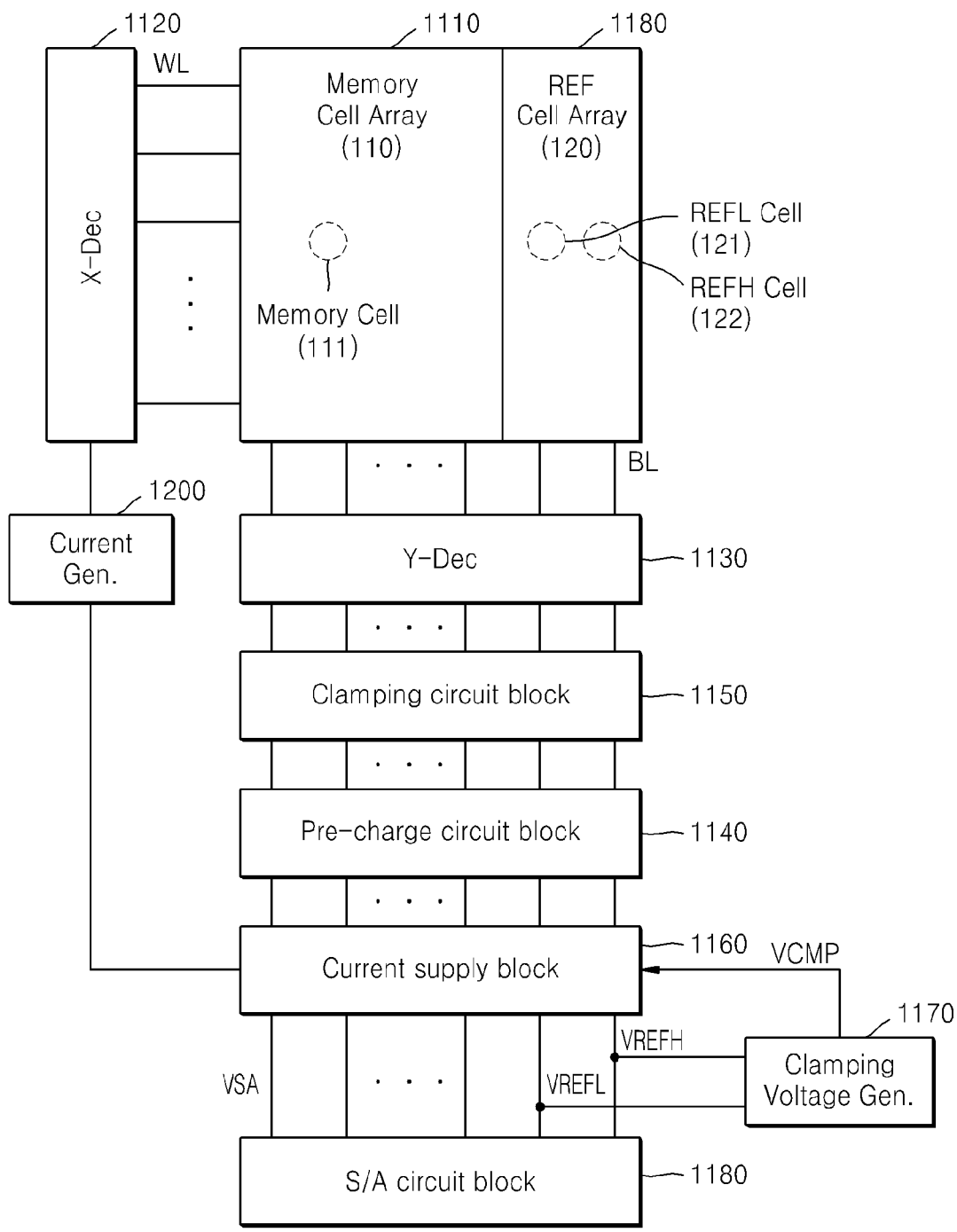
FIG. 1 is a block diagram of a memory device according to an embodiment of the inventive concept.

FIG. 1 is a block diagram of a memory device 1000 according to an embodiment of the inventive concept.

Referring to FIG. 1, memory device 1000 comprises a cell array 1110, a row decoder 1120, a column decoder 1130, a precharge circuit block 1140, a clamping circuit block 1150, a current supply block 1160, a clamping voltage generation unit 1170, an S/A circuit block 1180, and a current generator 1200.

Row decoder 1120 is used to select word lines WL of cell array 1110. Column decoder 1130 is used to select bit lines BL of cell array 1110. Precharge circuit block 1140 performs a precharge operation on bit lines BL. Clamping circuit block 1150 clamps a voltage of each of bit lines BL. Current generator 1200 generates current to be supplied to a memory cell read circuit (not shown). Current supply block 1160 supplies current generated by current generator 1200 to bit lines BL at a substantially constant level.

Clamping voltage generation unit 1170 generates a clamping voltage VCMP that varies according to a change in a cell resistance value within cell array 1110. S/A circuit block 1180 senses and amplifies a data voltage VSA of each of bit lines BL. The memory cell read circuit comprises various features for reading data from a memory cell. For example, current generator 1200 may generate current to be supplied to a word line or a bit line for reading of data from the memory cell, so it may form part of the memory cell read circuit.

Cell array 1110 comprises a memory cell array 110 and a reference cell array 120. Memory cell array 110 comprises a plurality of memory cells 111, which are nonvolatile memory cells formed near intersections of word lines WL and bit lines BL. Reference cell array 120 comprises a plurality of reference cells, e.g., first and second reference cells 121 and 122, that provide a first reference voltage VREFL and a second reference voltage VREFH, respectively. Memory cells 111 and first and second reference cells 121 and 122 typically have the same cell structure.

First and second reference cells 121 and 122 store data corresponding to logic high, e.g., data '1', or logic low, e.g., data '0'. For example, data corresponding to logic low is written to one of first and second reference cells 121 and 122 of reference cell array 120, e.g., first reference cell 121, and data corresponding to logic high is written to the other reference cell, e.g., second reference cell 122.

A write operation is performed on first and second reference cells 121 and 122 during a write operation of memory cells 111. The write operation is first performed on first and second reference cells 121 and 122 once, and first and second reference voltages VREFL and VREFH are obtained by performing a read operation on first and second reference cells 121 and 122 after the write operation. Where memory cells 111 are MRAM cells, for example, values of data stored in memory cells 111 or first and second reference cells 121 and 122 may vary over time. Thus, a rewrite operation may be performed on memory cells 111 at predetermined time intervals, and the rewrite operation may be performed on first and second reference cells 121 and 122 during the rewrite operation of memory cells 111.

First and second reference cells 121 and 122 are typically connected to one of word lines WL, and additional reference cells are generally connected to other word lines. Where a word line is selected for reading or writing data, the data may be written to first and second reference cells 121 and 122 connected to the selected word line WL, or first and second reference voltages VREFL and VREFH may be generated by reading the data from first and second reference cells 121 and 122, respectively.

Each of row decoder 1120 and column decoder 1130 typically comprises a plurality of metal oxide semiconductor (MOS) transistor-based switches. Row decoder 1120 selects word lines WL according to a row address, and column decoder 1130 selects bit lines BL according to a column address. Precharge circuit block 1140 precharges bit lines BL to a predetermined precharge level. Clamping circuit block 1150 clamps voltages of bit lines BL according to clamping voltage VCMP generated by clamping voltage generation unit 1170. Current generated by current generator 1200 is supplied to each of multiple read paths via current supply block 1160.

In a read operation, the voltages of bit lines BL that are precharged to the predetermined precharge level vary according to the respective values of data stored in memory cells 111. In other words, during the read operation the voltages of bit lines BL are developed according to the values of the data stored in memory cells 111.

Resistance values of memory cells 111 may be relatively large or small according to data stored therein. A data voltage VSA that varies according to the resistance value of each of memory cells 111 is applied to S/A circuit block 1180. S/A circuit block 1180 comprises a plurality of S/A circuits (not shown) that sense and amplify the data voltage VSA developed according to the data stored in memory cells 111.

Another bit line is additionally arranged to correspond to reference cell array 120. A precharge operation and a selection operation are performed in a reference cell read path in a manner similar to that of a memory cell read path. During a read operation, column decoder 1130 selects the bit lines BL connected to first reference cell 121 and second reference cell 122. Voltages of bit lines BL connected to first reference cell 121 and second reference cell 122 are developed, and the developed voltages are applied to clamping voltage generation unit 1170 as first and second reference voltages VREFL and VREFH.

Clamping voltage generation unit 1170 senses a change in first and second reference voltages VREFL and VREFH, adjusts clamping voltage VCMP according to the change in first and second reference voltages VREFL and VREFH, and feeds back the adjusted clamping voltage VCMP to clamping circuit block 1150. Clamping circuit block 1150 receives the adjusted clamping voltage VCMP and changes a voltage to be applied to bit lines BL. S/A circuit block 1180 receives first and second reference voltages VREFL and VREFH and outputs data by sensing and amplifying data voltage VSA based on first and second reference voltages VREFL and VREFH.

Figure 2:
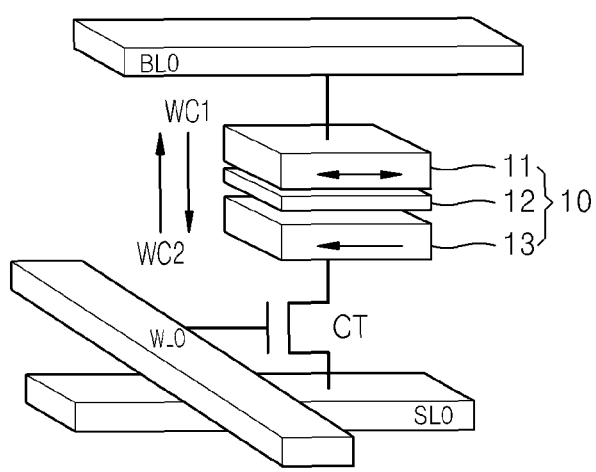
FIG. 2 is a three-dimensional (3D) view of a memory cell shown in FIG. 1 according to an embodiment of the inventive concept.

FIG. 2 is a 3D view of one of memory cells 111 of FIG. 1 according to an embodiment of the inventive concept. The memory cell of FIG. 2 is a spin transfer torque-magnetic random access memory (STT-MRAM).

Referring to FIG. 2, memory cell 111 comprises an MTJ cell 10 and a cell transistor CT. A gate of cell transistor CT is connected to a word line, e.g., a first word line WL0, and one electrode of cell transistor CT is connected to a bit line, e.g., a first bit line BL0, via MTJ cell 10. The other electrode of cell transistor CT is connected to a source line, e.g., a first source line SL0.

MTJ cell 10 comprises a free layer 11, a fixed layer 13, and a tunnel layer 12 between free layer 11 and fixed layer 13. Fixed layer 13 is magnetized in a fixed direction, and free layer 11 is magnetized in a direction that is the same or opposite to the magnetization direction of fixed layer 13 according to a magnetization condition. In some embodiments, memory cell 111 further comprises an anti-ferromagnetic layer (not shown) to fix the magnetization direction of fixed layer 13.

A resistance value of MTJ cell 10 varies according to the magnetization direction of free layer 11. Where the magnetization direction of free layer 11 is the same as that of fixed layer 13, MTJ cell 10 has a low resistance value and stores data '0'. Where the magnetization direction of free layer 11 is opposite to that of fixed layer 13, MTJ cell 10 has a high resistance value and stores data '1'. Although FIG. 2 illustrates free layer 11 and fixed layer 13 of MTJ cell 10 as horizontal magnetic elements, free layer 11 and fixed layer 13 may be vertical magnetic elements.

To write data in memory cell 111, a voltage that is logic high is applied to first word line WL0 to turn on cell transistor CT, and a write current, e.g., a first write current WC1 or a second write current WC2, is supplied between first bit line BL0 and first source line SL0. The magnetization direction of free layer 11 is determined by a direction in which first or second write current WC1 or WC2 is supplied. For example, where first write current WC1 is supplied between first bit line BL0 and first source line SL0, free electrons that spin in the same direction in which fixed layer 13 is magnetized apply torque to free layer 11. Thus, free layer 11 is magnetized in the same direction in which fixed layer 13 is magnetized. Where second write current WC2 is supplied between first bit line BL0 and first source line SL0, free electrons that spin in a direction opposite to the direction in which fixed layer 13 is magnetized return back to free layer 11 and apply torque to free layer 11. Then, free layer 11 is magnetized in a direction opposite to the direction in which fixed layer 13 is magnetized. That is, in MTJ cell 10, the magnetization direction of free layer 11 may be changed through application of STT.

To read data from memory cell 111, a voltage that is logic high is applied to first word line WL0 to turn on cell transistor CT, and a read current is supplied in a direction from first bit line BL0 to first source line SL0 to read data stored in MTJ cell 10. The intensity of the read current is much lower than those of write currents WC1 and WC2, and therefore the magnetization direction of free layer 11 is not changed by the read current.

In an STT-MRAM to which data is written by applying the STT, the difference between a reference voltage and a data voltage VSA used to determine data is typically very small, e.g., about 100 mV to 200 mV. Moreover, a resistance value of an MTJ cell may be changed due to various factors. Accordingly, the reliability of a read operation may be lowered where a data voltage VSA varies according to a resistance value of a memory cell.

Figure 3:
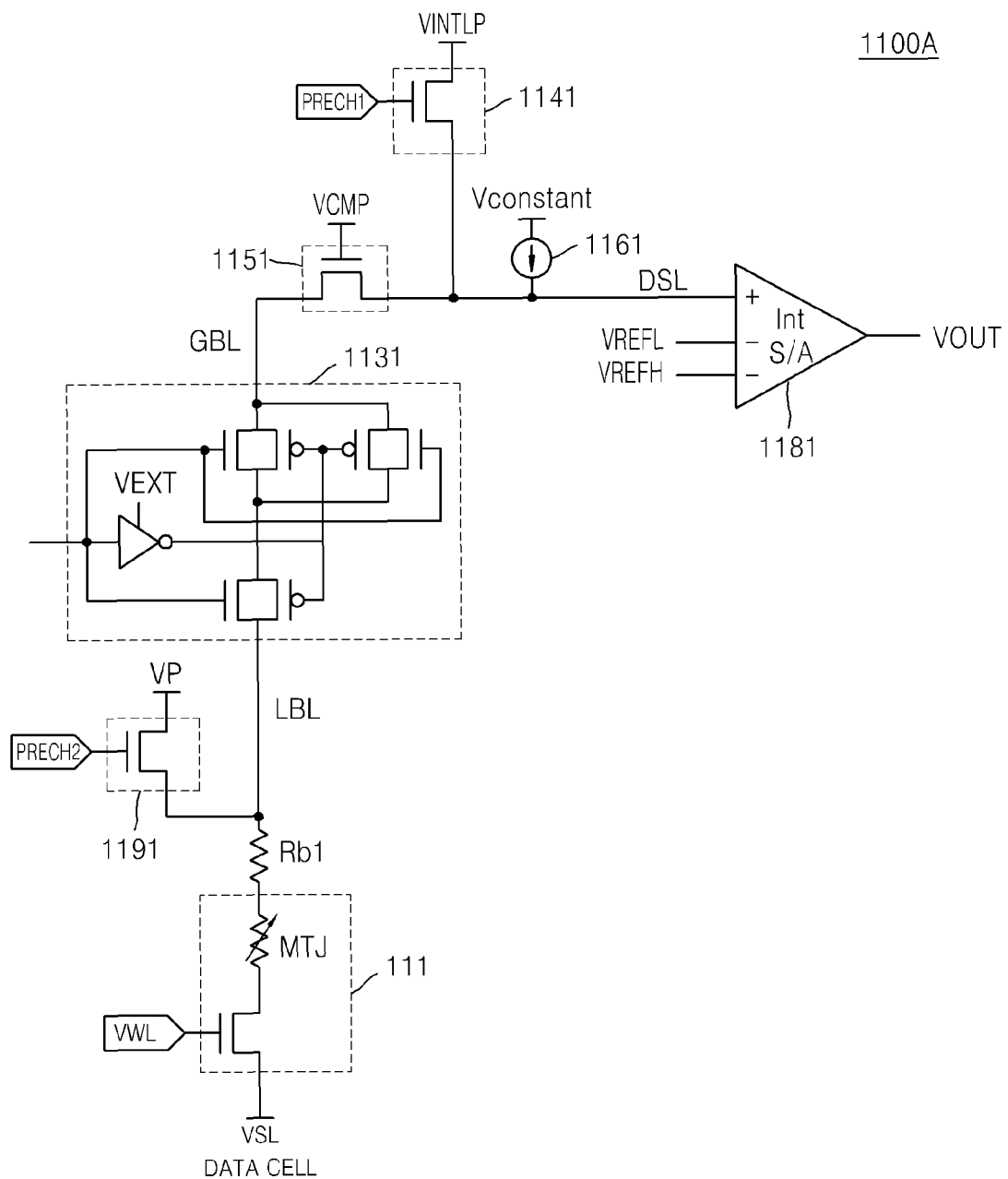
FIG. 3 is a circuit diagram of a memory cell read circuit of a memory device according to an embodiment of the inventive concept.

FIG. 3 is a circuit diagram of a memory cell read circuit 1100A of a memory device according to an embodiment of the inventive concept. Memory cell read circuit 1100A is typically arranged in a read path and comprises circuits related to a read operation. Memory cell read circuit 1100A typically comprises one or more features shown in FIG. 1, as well as various additional features. In the example of FIG. 3, memory cell read circuit 1100A comprises a first precharge circuit 1141 (e.g., precharge circuit block 1140 of FIG. 1) and a second precharge circuit 1191. Although FIG. 3 illustrates memory cell read circuit 1100A that reads data from one memory cell 111, a plurality of read circuits that read data from a plurality of memory cells may be included in memory device 1000 of FIG. 1.

Referring to FIG. 3, memory cell read circuit 1100A comprises first precharge circuit 1141, a bit line selection circuit 1131, a clamping circuit 1151, a current supply circuit 1161, second precharge circuit 1191, and an S/A circuit 1181. Clamping circuit 1151 can be formed as a clamping transistor in which a clamping voltage VCMP is applied to a gate. In FIG. 3, 'Rb1' represents a resistance component in a bit line.

In general, bit lines BL of FIG. 1 are lines through which signals are applied between memory cell 111 and S/A circuit 1181. In one example, bit lines BL comprise a local bit line LBL between memory cell 111 and bit line selection circuit 1131, a global bit line GBL between bit line selection circuit 1131 and clamping circuit 1151, and a data sensing line DSL between clamping circuit 1151 and S/A circuit 1181. The operation of memory cell read circuit 1100A will be described with respect to local bit line LBL, global bit line GBL, and data sensing line DSL below.

Memory cell 111 is connected to local bit line LBL, and a data voltage VSA developed according to data stored in memory cell 111 is delivered via data sensing line DSL. First precharge circuit 1141 precharges data sensing line DSL to a predetermined level, e.g., a precharge voltage VINTLP, and is incorporated in precharge circuit block 1140 of FIG. 1. Bit line selection circuit 1131 is controlled to be 'on' or 'off' according to a result of decoding a column address, and is incorporated in column decoder 1130 of FIG. 1. Clamping circuit 1151 clamps a voltage of data sensing line DSL and is arranged to correspond to each of the read paths. In addition, clamping circuit 1151 may be incorporated in clamping circuit block 1150 of FIG. 1. Clamping voltage VCMP applied to the gate of clamping circuit 1151 is provided from clamping voltage generation unit 1170 of FIG. 1.

Second precharge circuit 1191 controls a predetermined voltage VP to be selectively applied to one node in memory cell read circuit 1100A according to whether local bit line LBL is selected. For example, second precharge circuit 1191 controls predetermined voltage VP not to be applied to local bit line LBL that is selected, and predetermined voltage VP to be applied to local bit line LBL that is not selected. S/A circuit 1181 senses and amplifies data voltage VSA delivered via data sensing line DSL and is typically incorporated in S/A circuit block 1180 of FIG. 1. An output VOUT of S/A circuit 1181 can be latched by a latch circuit (not shown) and may be provided as read data to an external destination.

In a read operation performed by memory cell read circuit 1100A of FIG. 3, data sensing line DSL is precharged to the predetermined level, e.g., precharge voltage VINTLP, by first precharge circuit 1141 connected to memory cell 111. Where bit line selection circuit 1131 is switched on according to a column address, local bit line LBL is selected to read data from memory cell 111. Data voltage VSA developed according to data stored in memory cell 111 is input to S/A circuit 1181 via global bit line GBL and data sensing line DSL. Current supply circuit 1161 supplies current to data sensing line DSL with a substantially constant level, and clamping circuit 1151 adjusts data voltage VSA based on clamping voltage VCMP applied to the gate thereof.

Where memory cell 111 comprises an MRAM cell, a resistance value of a MTJ cell of memory cell 111 varies according to data stored in the MTJ cell, and data voltage VSA is developed according to the resistance value of the MTJ cell. Under these circumstances, it is difficult to reliably sense data because the resistance value of the MTJ cell of memory cell 111 may vary due to various factors.

Clamping voltage generation unit 1170 generates clamping voltage VCMP with a varying level according to the resistance value of the MTJ cell and feeds back clamping voltage VCMP to the gate of clamping circuit 1151. Clamping circuit 1151 adjusts a voltage of data sensing line DSL, e.g., data voltage VSA, according to clamping voltage VCMP. Thus, a variation in data voltage VSA according to the variation in the resistance value of the MTJ cell may be compensated for by performing a clamping operation with clamping circuit 1151.

In the embodiment of FIG. 3, memory cell read circuit 1100A senses and amplifies data voltage VSA using at least two reference voltages VREFL and VREFH. For example, S/A circuit 1181 receives data voltage VSA and first and second reference voltages VREFL and VRFEH, generates a differential output signal by comparing data voltage VSA and first and second reference voltages VREFL and VRFEH, and generates output VOUT by sensing and amplifying the differential output signal. Where first and second reference voltages VREFL and VREFH are generated using first and second reference cells 121 and 122 of FIG. 1, data voltage VSA is substantially equal to one of first and second reference voltages VREFL and VREFH, and the differential output signal is generated as a difference between data voltage VSA and the other reference voltage. Otherwise, where first and second reference voltages VREFL and VREFH are maintained constant and are generated outside or inside memory device 1000, a difference between data voltage VSA and first and second reference voltages VREFL and VREFH occurs as data voltage VSA is developed to generate the differential output signal.

Figure 4:
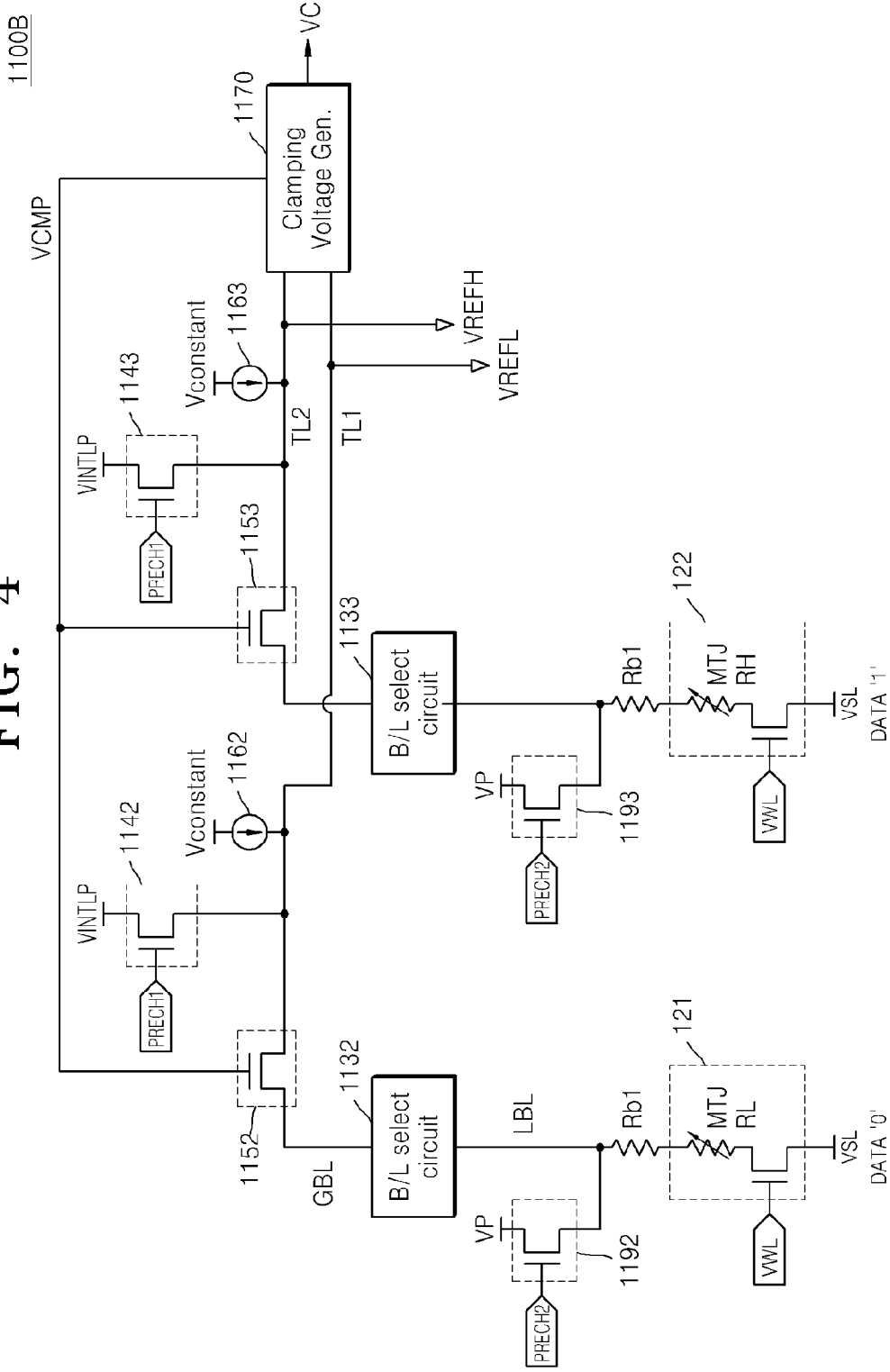
FIG. 4 is a circuit diagram of a reference cell read circuit of a memory device according to an embodiment of the inventive concept.

FIG. 4 is a circuit diagram of a reference cell read circuit 1100B of a memory device according to an embodiment of the inventive concept.

Referring to FIG. 4, reference cell read circuit 1100B comprises a first reference voltage VREFL path circuit that generates first reference voltage VREFL and a second reference voltage VREFH path circuit that generates a second reference voltage VREFH. In first reference voltage VREFL path circuit and second reference voltage VREFH path circuit, various circuits are arranged substantially the same as in memory cell read circuit 1000A of FIG. 3. For example, the first reference voltage VRFEL path circuit comprises a first precharge circuit 1142, a bit line selection circuit 1132, a clamping circuit 1152, a second precharge circuit 1192, and a current supply circuit 1162 that are connected to a first reference cell 121. The second reference voltage VREFH path circuit comprises a first precharge circuit 1143, a bit line selection circuit 1133, a clamping circuit 1153, a second precharge circuit 1193, and a current supply circuit 1163 that are connected to a second reference cell 122. Although clamping voltage generation unit 1170 is shown within reference cell read circuit 1100B, in alternative embodiments it may be located outside of reference cell read circuit 1100B.

In the embodiment of FIG. 4, bit lines may comprise local bit lines LBL between first reference cell 121 and bit line selection circuit 1132 and between second reference cell 122 and bit line selection circuit 1133, and global bit lines GBL between bit line selection circuit 1132 and clamping circuit 1152 and between bit line selection circuit 1133 and clamping circuit 1153. The bit lines may further comprise a transfer line TL1 through which a reference voltage is delivered between clamping circuit 1152 and clamping voltage generation unit 1170, and a transfer line TL2 through which a reference voltage is delivered between clamping circuit 1153 and clamping voltage generation unit 1170. Transfer lines TL1 and TL2 correspond to data sensing line DSL in memory cell read circuit 1000A of FIG. 3.

Where data is read from first and second reference cells 121 and 122, voltages of local bit lines LBL connected to first and second reference cells 121 and 122, respectively, are developed according to resistance values of MTJ cells of first and second reference cells 121 and 122. The developed voltages are applied as first and second reference voltages VREFL and VREFH to S/A circuit block 1180 of FIG. 1. First and second reference voltages VREFL and VREFH are applied to clamping voltage generation unit 1170. Then, clamping voltage generation unit 1170 generates a clamping voltage VCMP based on first and second reference voltages VREFL and VREFH that vary according to the resistance values of the MTJ cells. Because memory cell 111 of FIG. 3 and first and second reference cells 121 and 122 are fabricated according to the same process, resistance values of memory cell 111 and first and second reference cells 121 and 122 may vary in substantially the same manner. Thus, even if the resistance value of memory cell 111 that actually stores data is changed due to various factors, clamping voltage VCMP may be automatically adjusted by tracking the change in the resistance value of memory cell 111.

First and second reference cells 122 and 123 may have the same structure as memory cell 111, except that data '0' that has a low resistance value corresponding to logic low is stored in first reference cell 122, and first reference voltage VREFL is generated by reading data from first reference cell 121. Also, data '1' that has a high resistance value corresponding to logic high is stored in second reference cell 122, and second reference voltage VREFH is generated by reading data from second reference cell 122.

In a feedback operation, clamping voltage generation unit 1170 generates clamping voltage VCMP based on first and second reference voltages VREFL and VREFH. Clamping voltage VCMP is applied to gates of clamping circuit 1151 of memory cell read circuit 1100A of FIG. 3 and clamping circuits 1152 and 1153 of reference cell read circuit 1100B of FIG. 4. The 'turn-on' levels (or 'turn-on' states) of clamping circuit 1151 of memory cell read circuit 1100A and clamping circuits 1152 and 1153 of reference cell read circuit 1100B are controlled according to clamping voltage VCMP. A data voltage VSA and first and second reference voltages VREFL and VREFH are controlled according to the 'turn-on' levels of clamping circuits 1151, 1152, and 1153.

During a read operation, data voltage VSA or first and second reference voltages VREFL and VREFH that are initially applied to S/A circuit block 1180 are maintained constant through the feedback operation of clamping voltage generation unit 1170. In an initial stage of the read operation, a change in the resistance values of the first and second reference cells 122 and 123 may lead to a change in first and second reference voltages VREFL and VREFH. Nevertheless, under these circumstances, first and second reference voltages VREFL and VREFH may be controlled to be substantially symmetrical about a precharge voltage VINTLP by feeding back and clamping clamping voltage VCMP. Thus, first and second reference voltages VREFL and VREFH that are compensated for according to the resistance values of the first and second reference cells 122 and 123 may be applied to memory cell read circuit 1100A of FIG. 3.

Also, because clamping voltage VCMP is applied to clamping circuit 1151 of memory cell read circuit 1100A of FIG. 3, data voltage VSA may be developed to be substantially symmetrical about precharge voltage VINTLP even where the resistance value of memory cell 111 changes. Accordingly, S/A circuit 1181 may reliably sense data by using data voltage VSA and first and second reference voltages VREFL and VREFH.

In other words, under any circumstances, a data voltage VSA that is logic low or logic high may be developed to be substantially symmetrical about precharge voltage VINTLP, thereby improving data reliability. First and second reference voltages VREFL and VREFH may also be developed to be substantially symmetrical about precharge voltage VINTLP. Thus, the reliability of sensing data by using first and second reference voltages VREFL and VREFH may be improved.

As described above, first and second reference voltages VREFL and VREFH may change, and clamping voltage generation unit 1170 may adjust clamping voltage VCMP according to the change in first and second reference voltages VREFL and VREFH. Otherwise, even if there is a change in a resistance value of an MTJ cell or in a tunneling magneto resistance (TMR) that is a ratio between a resistance value that is logic high and a resistance value that is logic low of the MTJ cell, clamping voltage VCMP may be generated at an appropriate level by performing the feedback operation.

Figure 5:
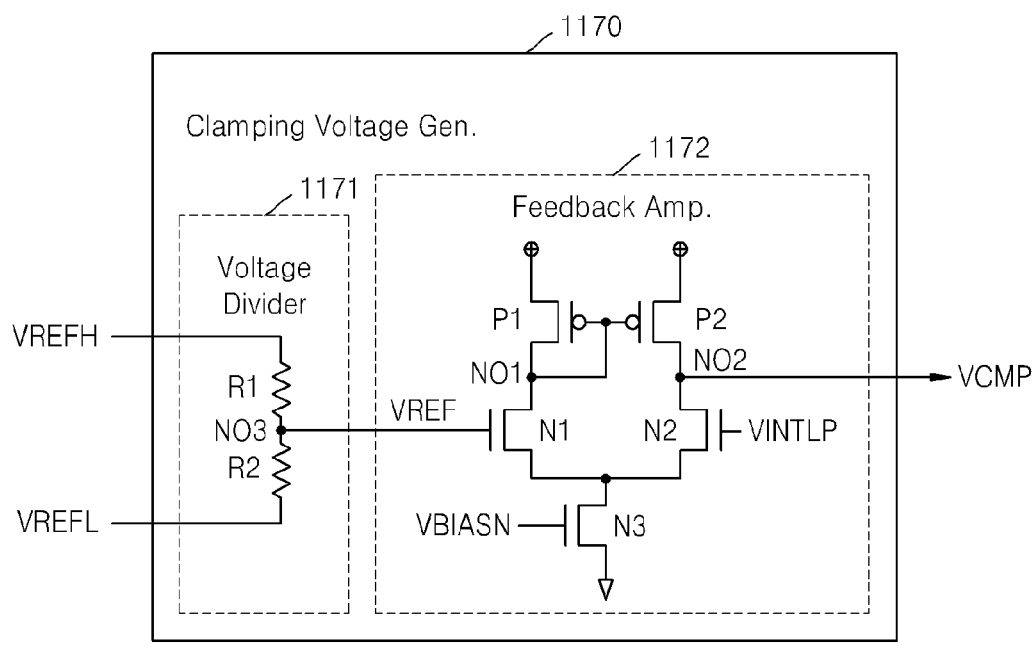
FIG. 5 is a circuit diagram of a clamping voltage generation unit of the reference cell read circuit of FIG. 4 according to an embodiment of the inventive concept.

FIG. 5 is a circuit diagram of clamping voltage generation unit 1170 of reference cell read circuit 1100B of FIG. 4 according to an embodiment of the inventive concept.

Referring to FIG. 5, clamping voltage generation unit 1170 comprises a voltage divider 1171 and a feedback amplifier 1172.

Voltage divider 1171 comprises resistors R1 and R2 to produce an average of first and second reference voltages VREFL and VREFH. Resistors R1 and R2 typically have the same resistance value. A third reference voltage VREF is generated by dividing first and second reference voltages VREFL and VREFH. A voltage of a node NO3 located between resistors R1 and R2 is substantially equal to third reference voltage VREF and is applied to feedback amplifier 1172. Third reference voltage VREF is an average voltage of first and second reference voltages VREFL and VREFH.

Feedback amplifier 1172 compares third reference voltage VREF applied from voltage divider 1171 with a predetermined voltage. Feedback amplifier 1172 compares third reference voltage VREF with a precharge voltage VINTLP and generates a clamping voltage VCMP by amplifying the difference between third reference voltage VREF and precharge voltage VINTLP.

Feedback amplifier 1172 comprises first to third NMOS transistors N1, N2, and N3 and first and second PMOS transistors P1 and P2. Third reference voltage VREF is applied to a gate of a first NMOS transistor N1 in feedback amplifier 1172. Precharge voltage VINTLP is applied to a gate of a second NMOS transistor N2 in feedback amplifier 1172. Source electrodes of first and second NMOS transistors N1 and N2 are commonly connected to a drain electrode of a third NMOS transistor N3. A source electrode of third NMOS transistor N3 is grounded. A biasing voltage VBINSN is applied to a gate of third NMOS transistor N3 to bias feedback amplifier 1172.

A drain electrode of first NMOS transistor N1 is connected to a source electrode of first PMOS transistor P1, and a drain electrode of second NMOS transistor N2 is connected to a source electrode of second PMOS transistor P2. A first node NO1 located between the drain electrode of first NMOS transistor N1 and the source electrode of first PMOS transistor P1 is connected to gates of first and second PMOS transistors P1 and P2. A second node NO2 located between the drain electrode of second NMOS transistor N2 and the source electrode of second PMOS transistor P2 is an output terminal of feedback amplifier 1172, through which clamping voltage VCMP is output.

During operation of feedback amplifier 1172 precharge voltage VINTLP is applied to feedback amplifier 1172. In response to this application of precharge voltage VINTLP, second NMOS transistor N2 is turned on. Second NMOS transistor N2 is kept turned on as long as precharge voltage VINTLP is higher than a threshold voltage of second NMOS transistor N2.

Where precharge voltage VINTLP is higher than third reference voltage VREF, second NMOS transistor N2 is turned on to a relatively high level, a voltage of second node NO2 is lowered, thus lowering clamping voltage VCMP that is to be output to an external destination. Where precharge voltage VINTLP is lower than third reference voltage VREF, an amount of current flowing through first and third NMOS transistors N1 and N3 increases and a voltage that is to be applied to first node NO1 is thus lowered. As the voltage of first node NO1 is lowered, current flows through first and second PMOS transistors P1 and P2. Thus, an amount of current flowing through first PMOS transistor P1 and second NMOS transistor N2 increases. Accordingly, the voltage of second node NO2 connected to the drain electrode of second NMOS transistor N2 is raised, and clamping voltage VCMP output via second node NO2 is also raised.

Figure 6:
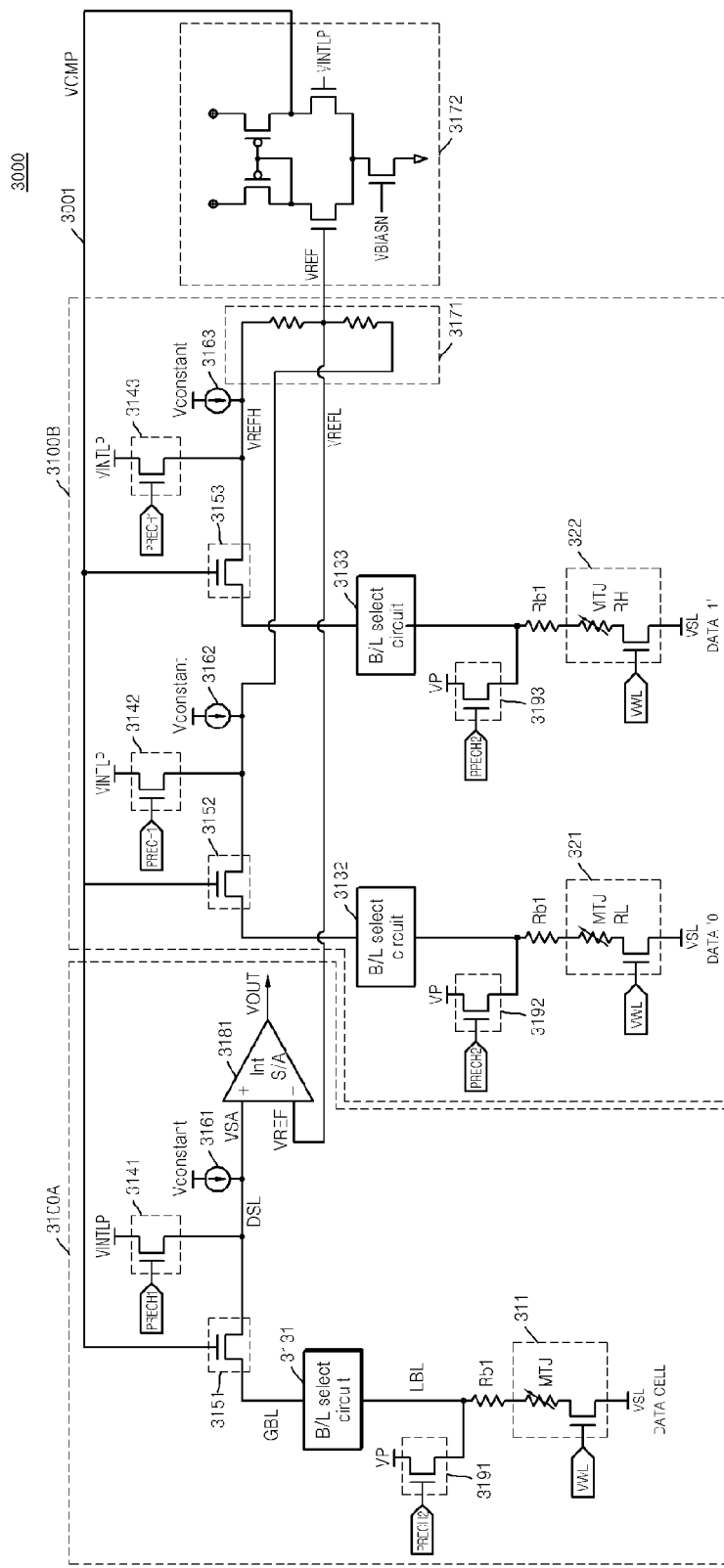
FIG. 6 is a circuit diagram of a memory device according to an embodiment of the inventive concept.

FIG. 6 is a circuit diagram of a memory device 3000 according to an embodiment of the inventive concept. Memory device 3000 has some of the same features as memory cell read circuit 1100A of FIG. 3 and reference cell read circuit 1100B, and a further description of the common features will be omitted in order to avoid redundancy.

Referring to FIG. 6, memory device 3000 comprises a memory cell read circuit 3100A, a reference cell read circuit 3100B, and a clamping voltage generation unit 3172.

Memory cell read circuit 3100A comprises a bit line selection circuit 3131, a first precharge circuit 3141, a clamping circuit 3151, a current supply circuit 3161, a read S/A circuit 3181, and a second precharge circuit 3191. First precharge circuit 3141 precharges a data sensing line DSL connected to a memory cell 311 to a predetermined level. Bit line selection circuit 3131 selects a local bit line LBL according to a column address. Clamping circuit 3151 performs a clamping operation. Current supply circuit 3161 supplies current at a substantially constant level via data sensing line DSL. Second precharge circuit 3191 selectively precharges a node of local bit line LBL according to whether local bit line LBL is selected. Read S/A circuit 3181 generates data VOUT (or, output data) by sensing and amplifying a developed data voltage VSA. In FIG. 6, 'Rb1' denotes a resistance component in a bit line.

Reference cell read circuit 3100B comprises a first reference voltage VREFL path circuit that generates a first reference voltage VREFL and a second reference voltage VREFH path circuit that generates a second reference voltage VREFH. In the first reference voltage VREFL path circuit and the second reference voltage VREFH path circuit, various circuits in memory cell read circuit 3100A are arranged substantially the same as in memory cell read circuit 3100A. In other words, the first reference voltage VRFEL path circuit comprises a first precharge circuit 3142, a bit line selection circuit 3132, a clamping circuit 3152, a second precharge circuit 3192, and a current supply circuit 3162 that are connected to a first reference cell 321. The second reference voltage VREFH path circuit comprises a first precharge circuit 3143, a bit line selection circuit 3133, a clamping circuit 3153, a second precharge circuit 3193, and a current supply circuit 3163 that are connected to a second reference cell 322.

Memory device 3000 further comprises a voltage divider 3171. Voltage divider 3171 comprises a plurality of resistors to divide first and second reference voltages VREFL and VREFH. A third reference voltage VREF generated by voltage divider 3171 is applied to read S/A circuit 3181 of memory cell read circuit 3100A to sense data and is applied to clamping voltage generation unit 3172 to generate a clamping voltage VCMP. Clamping voltage generation unit 3172 has substantially the same structure as feedback amplifier 1172 of FIG. 5, and it generates clamping voltage VCMP by amplifying the difference between third reference voltage VREF and a precharge voltage VINTLP.

Read S/A circuit 3181 generates an output data VOUT by using a data voltage VSA and third reference voltage VREF. Thus, voltage divider 3171 is used for data sensing. Accordingly, unlike some other embodiments, clamping voltage generation unit 3172 does not incorporate a plurality of resistors and may generate clamping voltage VCMP from third reference voltage VREF generated by voltage divider 3171.

Where memory device 3000 is powered on, first reference voltage VREFL path circuit and second reference voltage VREFH path circuit respectively perform a read operation on first and second reference cells 321 and 322 to generate first reference voltage VREFL and second reference voltage VREFH, respectively. Thereafter, if voltage divider 3171 outputs third reference voltage VREF, which is an average voltage of first reference voltage VREFL and second reference voltage VREFH, and applies third reference voltage VREF to clamping voltage generation unit 3172, clamping voltage VCMP is generated to be automatically adjusted according to third reference voltage VREF. Clamping voltage VCMP is applied to memory cell read circuit 3100A and reference cell read circuit 3100B. Under these circumstances, even where there is a change in resistance values of MTJ cells of memory cell 311 or the first and second reference cells 321 and 322 or in a TMR, clamping voltage VCMP may be generated at an appropriate level by performing such a feedback operation.

The 'on' levels of clamping circuits 3151, 3152, and 3153 of memory cell read circuit 3100A and reference cell read circuit 3100B may be controlled according to clamping voltage VCMP so that data voltage VSA or first and second reference voltages VREFL and VREFH is developed to be substantially symmetrical about precharge voltage VINTLP. In other words, a data voltage VSA of logic low or logic high may be developed to be substantially symmetrical about precharge voltage VINTLP, which can improve data reliability.

Figure 7A:
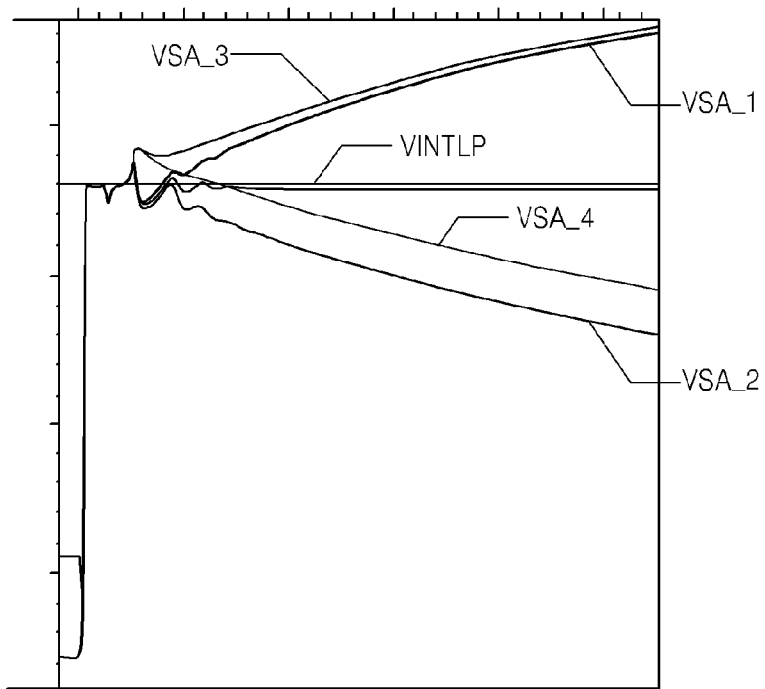
FIG. 7A is a graph showing waveforms of a data voltage of a sense amplifier (S/A) circuit of FIG. 3 or FIG. 6.
Figure 7B:
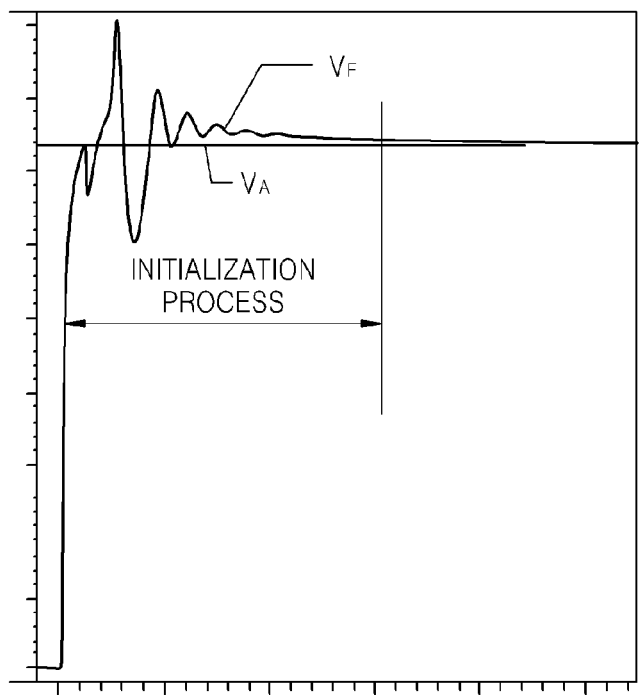
FIG. 7B is a graph showing waveforms of a clamping voltage according to an embodiment of the inventive concept.
Figure 8A:
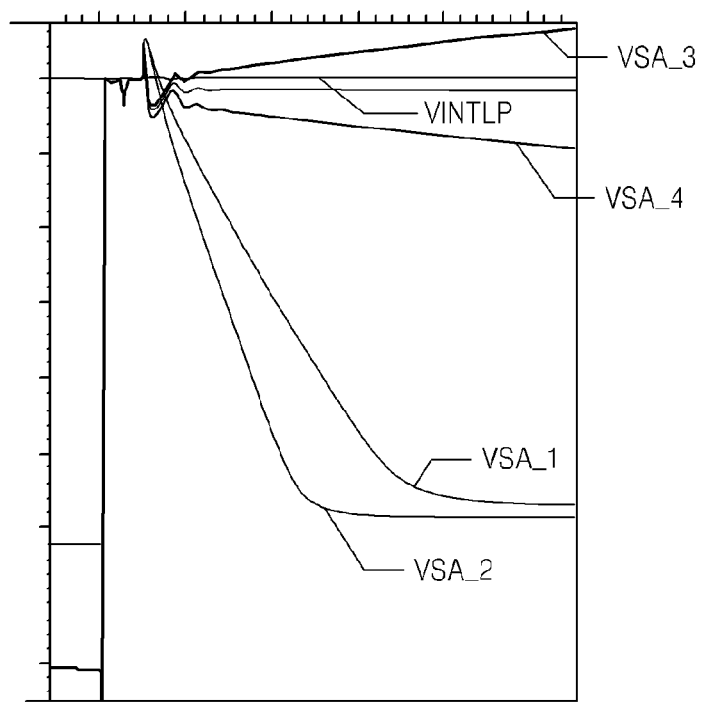
FIG. 8A is a graph showing waveforms of a data voltage of the S/A circuit of FIG. 3 or FIG. 6.
Figure 8B:
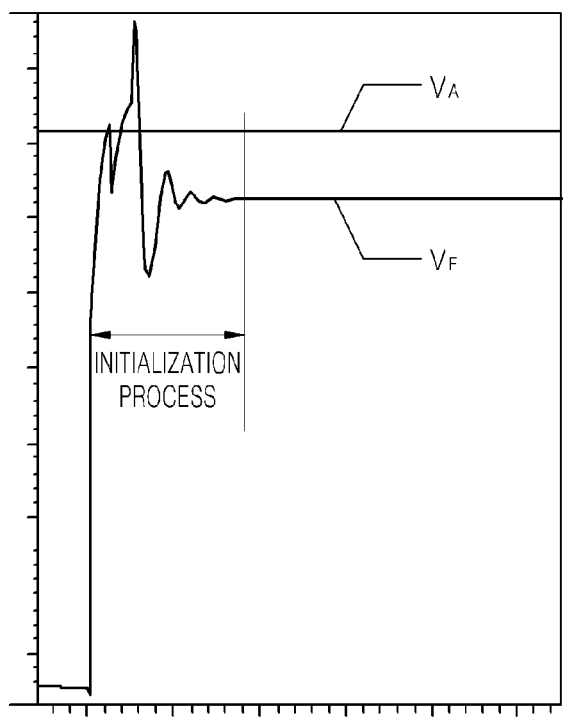
FIG. 8B is a graph showing waveforms of a clamping voltage according to an embodiment of the inventive concept.
Figure 9A:
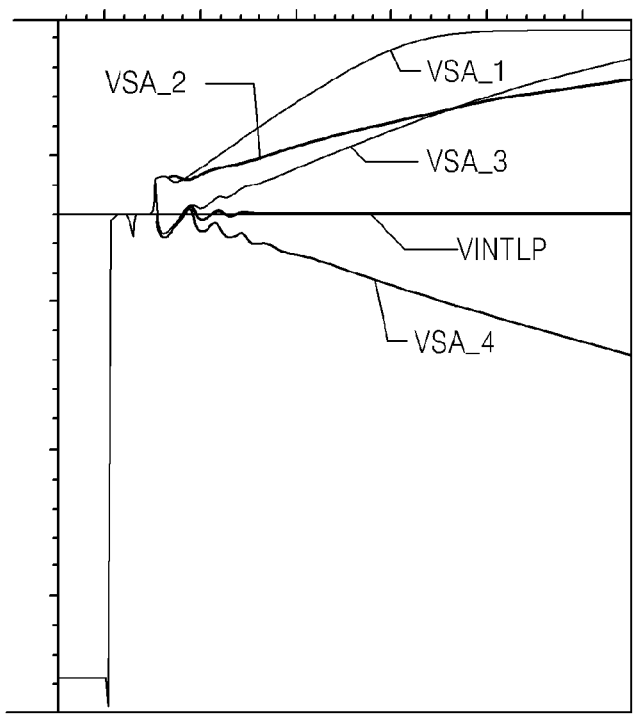
FIG. 9A is a graph showing waveforms of a data voltage of the S/A circuit of FIG. 3 or FIG. 6.

FIGS. 7A, 8A, and 9A are graphs showing waveforms of a data voltage VSA of FIG. 3 and FIG. 6, and FIGS. 7B, 8B, and 9B are graphs showing waveforms of a clamping voltage VCMP according to embodiments of the inventive concept.

Where a read operation is performed on memory cells, clamping voltage VCMP that is to be applied to a gate of clamping circuit 3151 of FIG. 6 may be set based on a resistance value of one of the memory cells (or an MTJ cell). However, where an analog bias voltage is provided as a clamping voltage $V_A$ at a substantially constant level from an external source, the resistance value of the MTJ cell varies, thereby preventing read S/A circuit 3181 from reliably sensing data.

FIGS. 7A and 7B are graphs respectively showing waveforms of a data voltage VSA and a clamping voltage VCMP where an actual resistance value of an MTJ cell is substantially equal to a resistance value of the MTJ cell based on which clamping voltage VCMP is set. For example, FIG. 7A illustrates an example where clamping voltage VCMP is set based on a low resistance value (e.g., 40 KΩ) of an MTJ cell and an actual low resistance value of the MTJ cell is also 40 KΩ. In this example, to apply clamping voltage VCMP, first clamping voltage $V_A$ that has been set regardless of a resistance value of a MTJ cell is received from an external source or a second clamping voltage $V_F$ that varies according to resistance values of MTJ cells of reference cells may be received.

FIG. 7A illustrates waveforms of a data voltage VSA applied to read S/A circuit 3181. In the example of FIG. 7A, first and second data voltages VSA_1 and VSA_2 are shown as waveforms of data voltages where first clamping voltage $V_A$ is received from an external source, and third and fourth data voltages VSA_3 and VSA_4 are shown as waveforms of data voltages when second clamping voltage $V_F$ is generated through a feedback operation of clamping voltage generation unit 3172 of FIG. 6. In the example of FIG. 7A, it is assumed that a resistance value of an MTJ cell that stores data is fixed. Over time, first and third data voltages VSA_1 and VSA_3, which relate to data '1', and second and fourth data voltages VSA_2 and VSA_4, which relate to data '0', are developed to be substantially symmetrical about a precharge voltage VINTLP.

FIG. 7B illustrates waveforms of a clamping voltage VCMP applied to a gate of clamping circuit 3151 of FIG. 6. In the example of FIG. 7B, because an actual resistance value of an MTJ cell is substantially equal to a resistance value of the MTJ cell based on which clamping voltage VCMP is set, a first clamping voltage $V_A$ that is received at a substantially constant level from an external source is also substantially equal to a second clamping voltage $V_F$ generated through a feedback operation of clamp voltage generation unit 3172. For signal stability, second clamping voltage $V_F$ is processed according to a predetermined initialization process and is then applied to clamping circuit 3151.

FIGS. 8A and 8B are graphs respectively showing waveforms of a data voltage VSA and a clamping voltage VCMP when an actual low resistance value of an MTJ cell is lowered, for example, to 4 KΩ. For example, in a memory device, clamping voltage VCMP is set based on a low resistance value, e.g., 40 KΩ, of an MTJ cell, but an actual low resistance value of MTJ cell is 4 KΩ. Under these circumstances, to apply clamping voltage VCMP, a first clamping voltage $V_A$ that has been set regardless of an actual resistance value of a MTJ cell is received from an external source or a second clamping voltage $V_F$ that varies according to resistance values of MTJ cells of reference cells may be received.

FIG. 8A shows waveforms of a data voltage VSA applied to read S/A circuit 3181. In the example of FIG. 8A, first and second data voltages VSA_1 and VSA_2 are shown as waveforms of data voltages where first clamping voltage $V_A$ is received from an external source. Where first clamping voltage $V_A$ is applied to clamping circuit 3151, both first data voltage VSA_1, which relates to data '1', and second data voltage VSA_2, which relates to data '0', are developed to be lower than a precharge voltage VINTLP. In other words, first and second data voltages VSA_1 and VSA_2 according to data stored in a memory cell are developed to be asymmetrical about precharge voltage VINTLP. Under these circumstances, read S/A circuit 3181 may not reliably sense data.

Third and fourth data voltages VSA_3 and VSA_4 are shown as waveforms of data voltages where second clamping voltage $V_F$ is generated through a feedback operation of clamping voltage generation unit 3172. Where second clamping voltage $V_F$ is applied to clamping circuit 3151, third data voltage VSA_3, which relates to data '1', is developed to be higher than precharge voltage VINTLP, and fourth data voltage VSA_4, which relates to data '0', is developed to be lower than precharge voltage VINTLP. Over time, third and fourth data voltages VSA_3 and VSA_4 are developed to be asymmetrical about precharge voltage VINTLP. In other words, because an actual resistance value of an MTJ cell may be different from a preset resistance value or may vary over time, clamping voltage VCMP applied to the gate of clamping circuit 3151 may be adjusted to improve data reliability.

FIG. 8B illustrates waveforms of a clamping voltage VCMP applied to gate of clamping circuit 3151 of FIG. 6.

Referring to FIGS. 6 and 8B, where an actual resistance value of an MTJ cell is lower than a resistance value of the MTJ cell based on which clamping voltage VCMP is set, a large amount of current is discharged via a source line connected to the MTJ cell while first and second data voltages VSA_1 and VSA_2 of FIG. 8A are developed. Consequently, both data voltages VSA become lower than precharge voltage VINTLP. Under these circumstances, a read operation may not be performed reliably.

A third reference voltage VREF, which is an average voltage of first and second reference voltages VREFL and VREFH, is applied to clamping voltage generation unit 3172. Clamping voltage generation unit 3172 generates a second clamping voltage $V_F$ based on third reference voltage VREF. Second clamping voltage $V_F$ is lower than a first clamping voltage $V_A$ applied at a substantially constant level from an external source. For signal stability, second clamping voltage $V_F$ may be initialized.

Figure 9B:
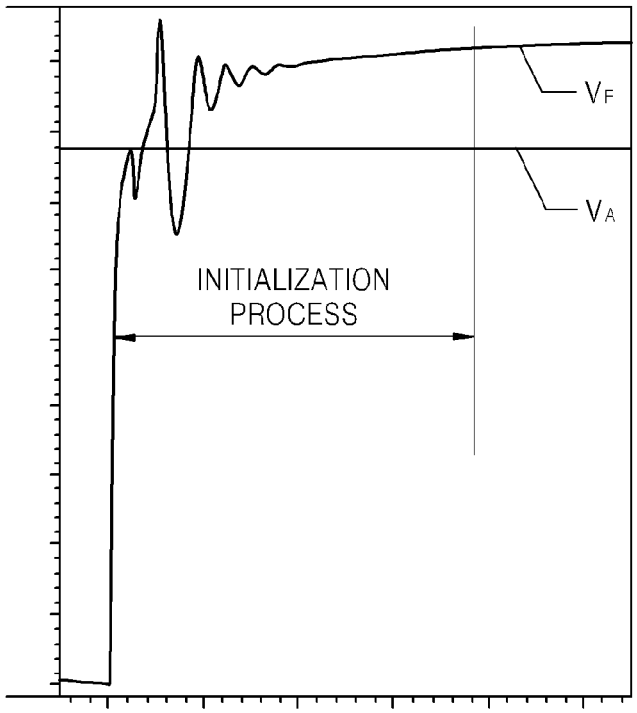
FIG. 9B is a graph showing waveforms of a clamping voltage according to an embodiment of the inventive concept.

FIGS. 9A and 9B are graphs respectively showing waveforms of a data voltage VSA and a clamping voltage VCMP where an actual resistance value of an MTJ cell is raised. For example, in a memory device, a low resistance value of an MTJ cell changes to 100 KΩ.

FIG. 9A illustrates waveforms of a data voltage VSA applied to read S/A circuit 3181. In the example of FIG. 9A, first and second data voltages VSA_1 and VSA_2 are shown as waveforms of data voltages where a first clamping voltage $V_A$ is received from an external source. Where first clamping voltage $V_A$ is applied to clamping circuit 3151, both first data voltage VSA_1, which relates to data '1', and second data voltage VSA_2, which relates to data '0', are developed to be higher than the precharge voltage VINTLP. In other words, first and second data voltages VSA_1 and VSA_2 are developed to be asymmetrical about precharge voltage VINTLP. Under these circumstances, read S/A circuit 3181 may not reliably sense data.

Third and fourth data voltages VSA_3 and VSA_4 are shown as waveforms of data voltages when a second clamping voltage $V_F$ is generated through a feedback operation of clamping voltage generation unit 3172. Where second clamping voltage $V_F$ is applied to clamping circuit 3151, third data voltage VSA_3, which relates to data '1', is developed to be higher than precharge voltage VINTLP, and fourth data voltage VSA_4, which relates to data '0' is developed to be lower than precharge voltage VINTLP. Over time, third and fourth data voltages VSA_3 and VSA_4 are developed to be asymmetrical about precharge voltage VINTLP. In other words, because an actual resistance value of an MTJ cell may be different from a preset resistance value or may vary over time, clamping voltage VCMP applied to the gate of clamping circuit 3151 may be adjusted to improve data reliability.

FIG. 9B illustrates waveforms of a clamping voltage VCMP applied to a gate of clamping circuit 3151 of FIG. 6.

Referring to FIGS. 6 and 9B, where an actual resistance value of an MTJ cell changes to a large degree, a relatively small amount of current is discharged via a source line connected to the MTJ cell while the first and second data voltages VSA_1 and VSA_2 of FIG. 9A are developed. Accordingly, both the first and second data voltages VSA_1 and VSA_2, which relate to logic low '0' and logic high '1', are developed to be higher than precharge voltage VINTLP. Under these circumstances, a read operation may not be performed reliably.

A third reference voltage VREF is applied to clamping voltage generation unit 3172. This voltage is an average voltage of first and second reference voltages VREFL and VREFH generated by performing a read operation on reference cells. Clamping voltage generation unit 3172 generates a second clamping voltage $V_F$ based on third reference voltage VREF. Under these circumstances, second clamping voltage $V_F$ is higher than a first clamping voltage $V_A$ applied at a substantially constant level from an external source. For signal stability, second clamping voltage $V_F$ may be initialized.

Figure 10:
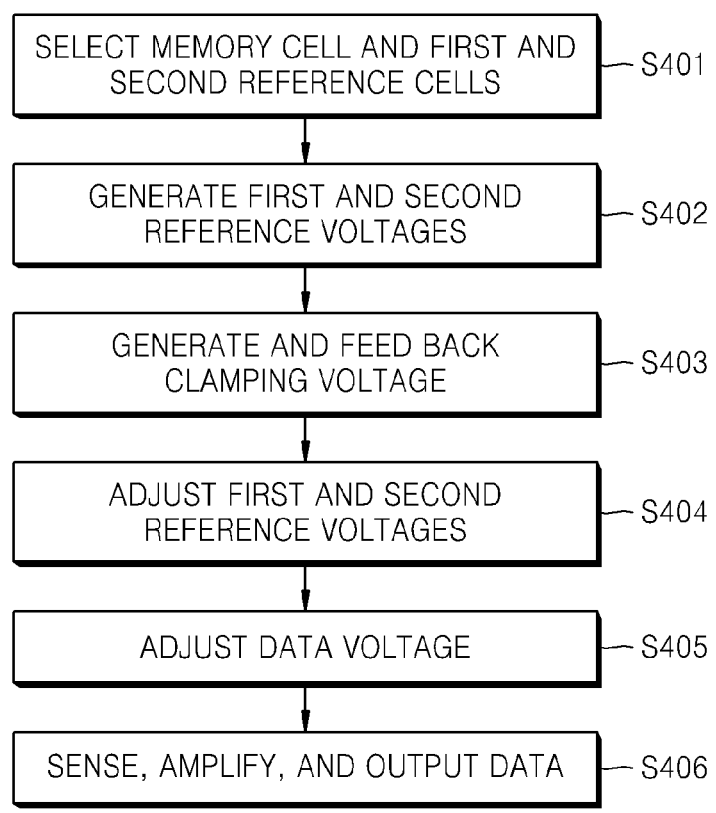
FIG. 10 is a flowchart illustrating a method of reading data from a memory device according to an embodiment of the inventive concept.

FIG. 10 is a flowchart illustrating a method of reading data from a memory device, according to an embodiment of the inventive concept. In the description that follows, example method steps are indicated by parentheses. For convenience, the method is described with reference to memory device 3000 of FIG. 6.

Referring to FIGS. 6 to 10, memory cell 311 and first and second reference cells 321 and 322 are selected to perform a read operation on memory device 3000 (S401). Thereafter, first and second reference voltages VREFL and VREFH are generated by reference cell read circuit 3100B (S402). First and second reference voltages VREFL and VREFH are applied to clamping voltage generation unit 3172. As described above, a third reference voltage VREF, which is an average voltage of first and second reference voltages VREFL and VREFH generated by performing the read operation on the first and second reference cells 321 and 322, is applied to clamping voltage generation unit 3172. Voltage divider 3171 may be located inside or outside clamping voltage generation unit 3172 to divide first and second reference voltages VREFL and VREFH. Third reference voltage VREF varies according to resistance values of the first and second reference cells 321 and 322.

Then, clamping voltage generation unit 3172 generates a clamping voltage VCMP based on third reference voltage VREF, feeds back clamping voltage VCMP, and applies clamping voltage VCMP to clamping circuit 3151 of memory cell read circuit 3100A and clamping circuits 3152 and 3153 of reference cell read circuit 3100B (S403). First and second reference voltages VREFL and VREFH are adjusted by performing a clamping operation according to clamping voltage VCMP (S404). For example, first and second reference voltages VREFL and VREFH may be developed based a precharge voltage VINTLP. Then, a data voltage VSA is adjusted by applying clamping voltage VCMP to memory cell read circuit 3100A (S405). For example, data voltage VSA may be developed based precharge voltage VINTLP. Then, read S/A circuit 3181 senses, amplifies, and outputs data by using adjusted data voltage VSA and first and second reference voltages VREFL and VREFH (S406).

Figure 11A:
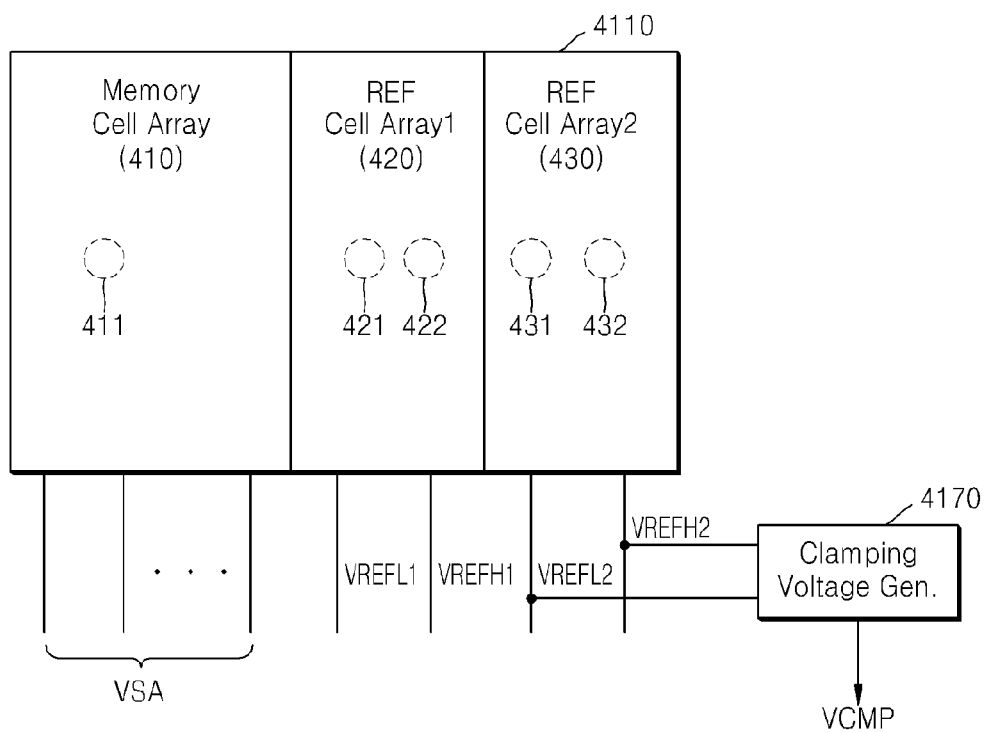
FIG. 11A is a block diagram of a memory device according to an embodiment of the inventive concept.
Figure 11B:
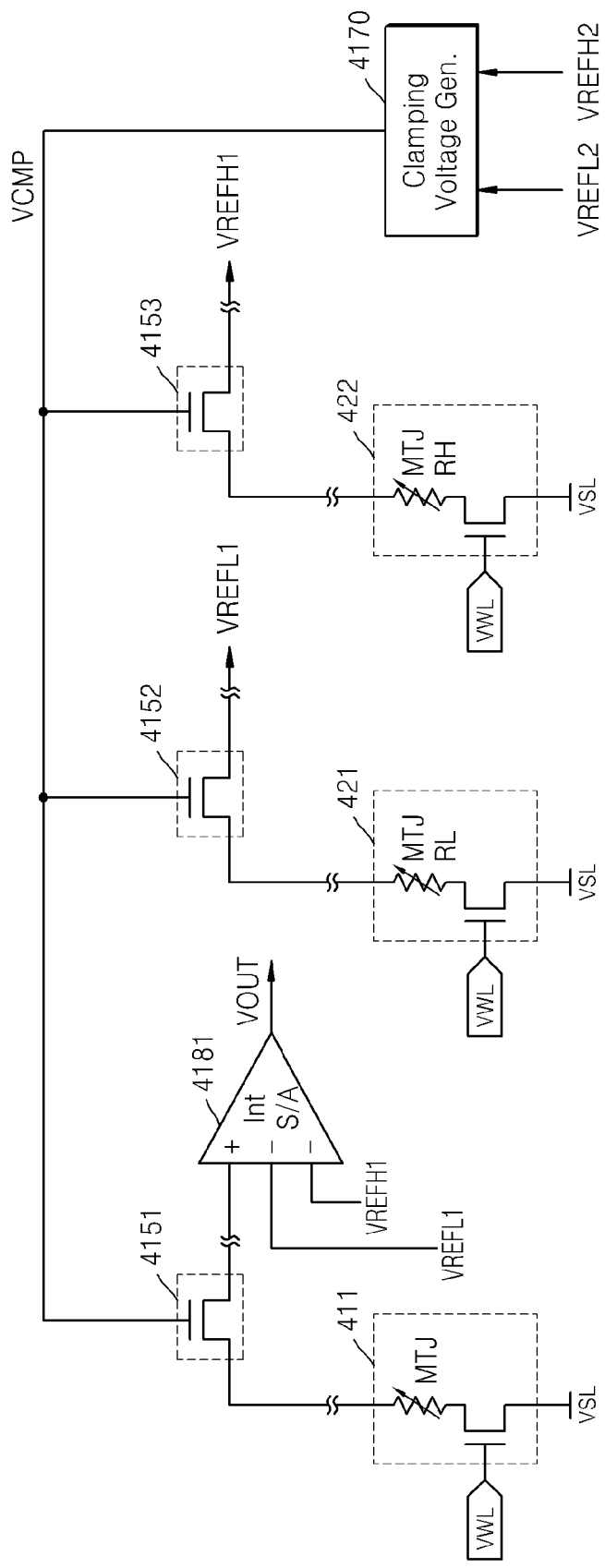
FIG. 11B is a circuit diagram of a memory device according to an embodiment of the inventive concept.

FIG. 11A is a block diagram of a memory device 4000 according to an embodiment of the inventive concept, and FIG. 11B is a circuit diagram of a memory device 4000 according to an embodiment of the inventive concept. Memory device 4000 has some of the same features as other embodiments described above, and a further description of the common features will be omitted in order to avoid redundancy.

Referring to FIGS. 11A and 11B, memory device 4000 comprises a cell array 4110. Cell array 4110 comprises a memory cell array 410, a first reference cell array 420, and a second reference cell array 430. Memory cell array 410 comprises a memory cell 411. First reference cell array 420 comprises a first reference cell 421 that generates a first reference voltage VREFL1, and a second reference cell 422 that generates a second reference voltage VREFH1. Second reference cell array 430 comprises a third reference cell 431 that generates a third reference voltage VREFL2, and a fourth reference cell 432 that generates a fourth reference voltage VREFH2. First reference voltage VREFL1 and third reference voltage VREFL2 are substantially equal to each other, and second reference voltage VREFH1 and fourth reference voltage VREFH2 are substantially equal to each other.

Memory device 4000 comprises one cell array that comprises reference cells to generate reference voltages for sensing data, and another cell array that comprises reference cells to generate reference voltages for generating a clamping voltage VCMP. For example, first and second reference voltages VREFL1 and VREFH1 are applied from first reference cell array 420 to an S/A circuit 4181 that senses data. Also, the third and fourth reference voltages VREFL2 and VREFH2 are applied from second reference cell array 430 to a clamping voltage generation unit 4170. Clamping voltage generation unit 4170 generates a clamping voltage VCMP with a value that varies according to resistance values of the third and fourth reference cells 431 and 432.

Clamping voltage VCMP is fed back to gates of a clamping circuit 4151 connected to memory cell 411 and clamping circuits 4152 and 4153 connected to the first and second reference cells 421 and 422. Accordingly, first and second reference voltages VREFL1 and VREFH1 are developed to be substantially symmetrical about a predetermined level, e.g., a precharge voltage. A data voltage VSA is also developed to be substantially symmetrical about the predetermined level. Although not shown in FIGS. 11A and 11B, a circuit that reads data from third and fourth reference cells 431 and 432 may have the same structure as a circuit that reads data from the first and second reference cells 421 and 422. Clamping voltage VCMP may also be fed back to a clamping circuit (not shown) in the circuit that reads data from the third and fourth reference cells 431 and 432.

Figure 12:
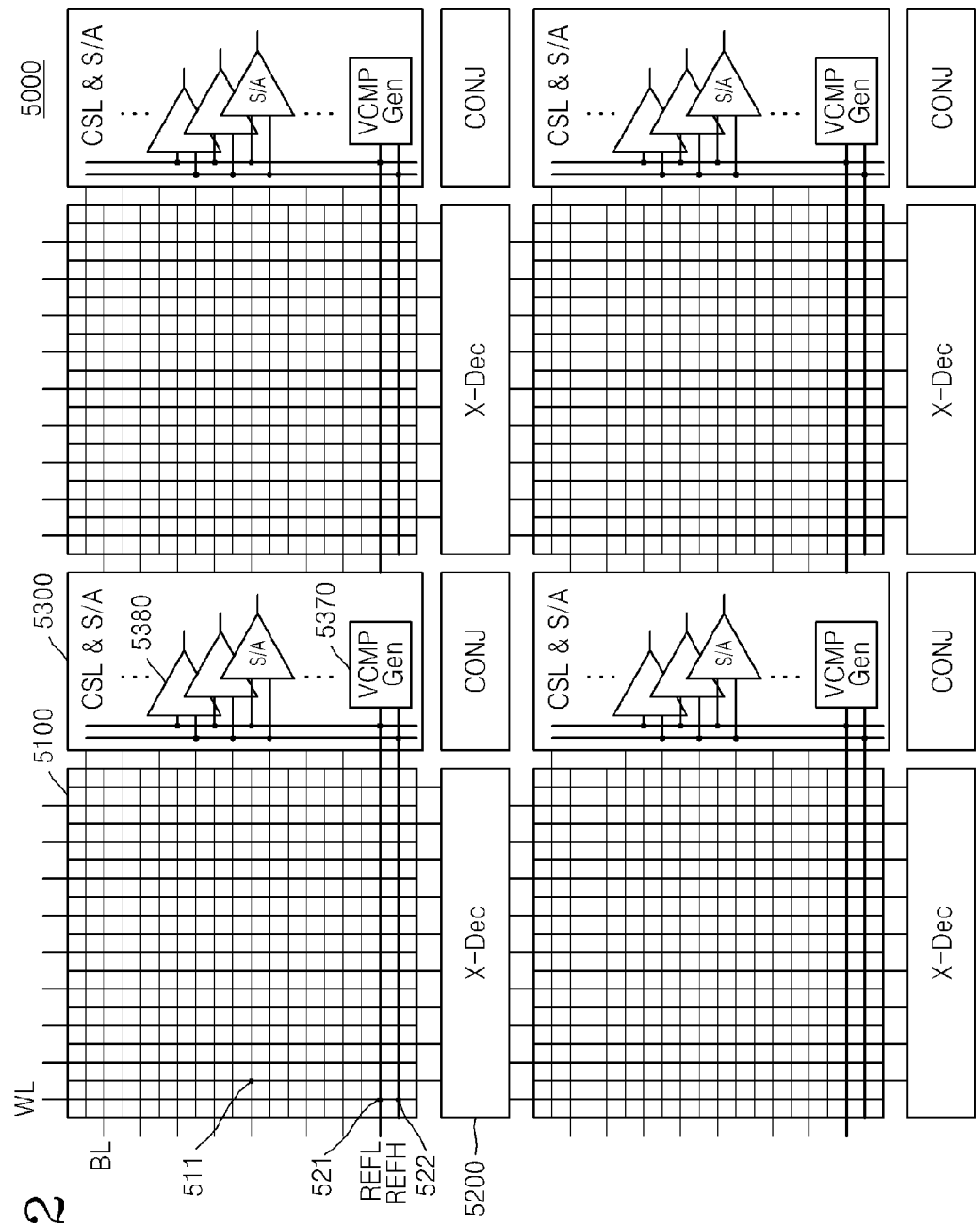
FIG. 12 is a block diagram illustrating a layout of a memory device according to an embodiment of the inventive concept.
Figure 13:
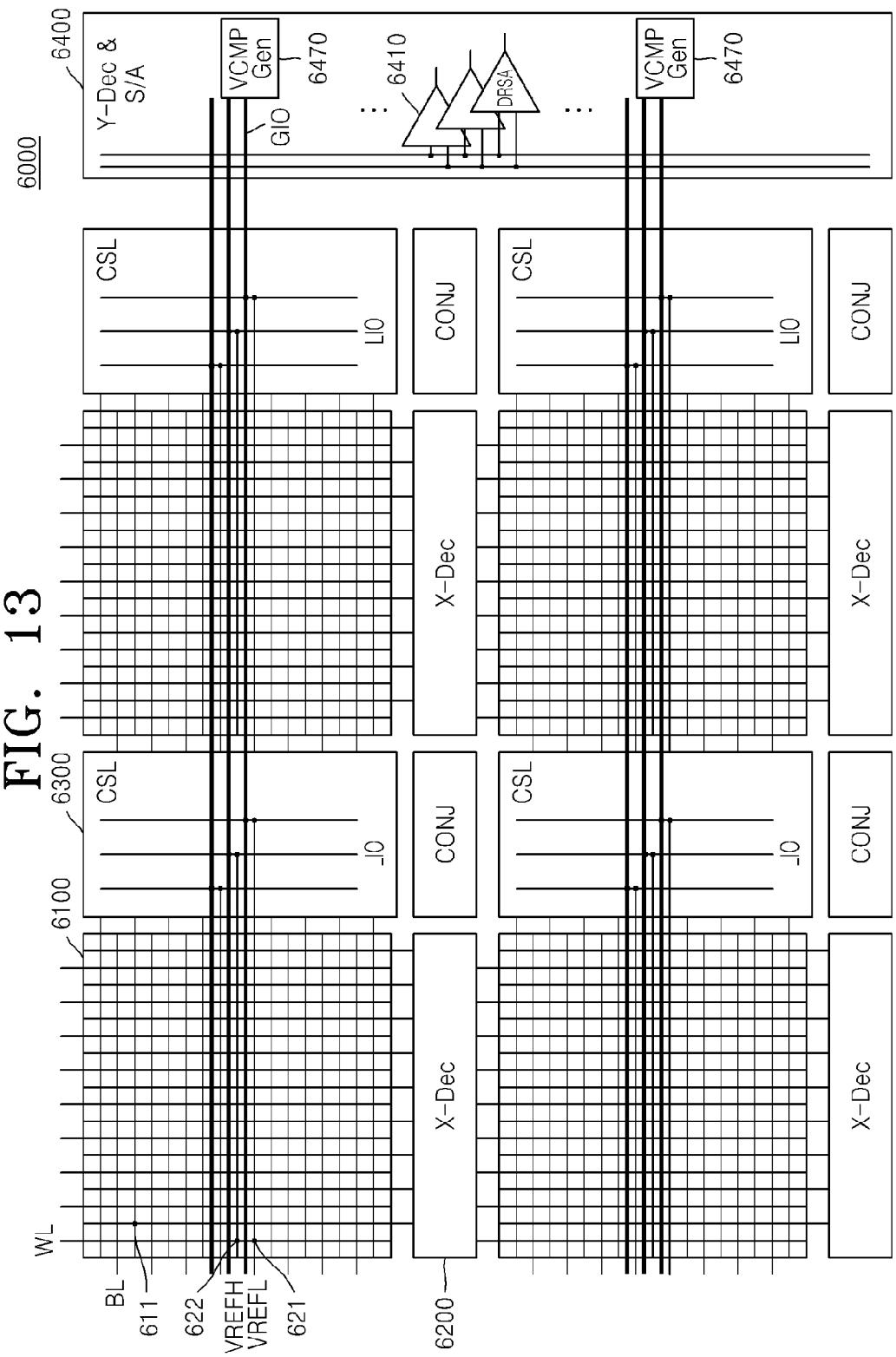
FIG. 13 is a block diagram illustrating a layout of a memory device according to an embodiment of the inventive concept.

FIG. 12 is a block diagram illustrating a layout of a memory device 5000 according to an embodiment of the inventive concept, and FIG. 13 is a block diagram illustrating a layout of a memory device 6000 according to an embodiment of the inventive concept. In the embodiment of FIG. 12 an S/A circuit block comprising a plurality of S/A circuits 5380 is arranged to correspond to each of a plurality of cell arrays 5100. In the embodiment of FIG. 13, a plurality of cell arrays 6100 share an S/A circuit block comprising a plurality of S/A circuits 6410.

Referring to FIG. 12, memory device 5000 comprises cell arrays 5100 each comprising a plurality of memory cells 511, a plurality of row decoders 5200 that respectively select word lines for cell arrays 5100, and a plurality of column selection blocks 5300 that respectively select local bit lines for cell arrays 5100. Each of column selection blocks 5300 comprises a plurality of S/a circuits 5380 of a data read circuit. Each of column selection blocks 5300 controls an electrical connection between one of memory cells 511 and one of S/A circuits 5380 according to a column selection signal received from a column decoder (not shown).

Each of cell arrays 5100 comprises a plurality of reference cells to generate first and second reference voltages VREFH and VREFL. For example, each of cell arrays 5100 comprises a first reference cell 521 that generates first reference voltage VREFL and a second reference cell 522 that generates second reference voltage VREFH. Memory cells 511 and the first and second reference cells 521 and 522 may be connected to one word line. A data voltage VSA generated by each of memory cells 511 may be applied to one input terminal of one of plurality of S/A circuits 5380, via corresponding data sensing lines.

Voltages developed based on the first and second reference cells 521 and 522 are applied to clamping voltage generation unit 5370 as the first and second reference voltages VREFH and VREFL. Column selection block 5300 comprises plurality of S/A circuits 5380, and a clamping voltage VCMP generated by clamping voltage generation unit 5370 may be commonly applied to a gate of a clamping circuit (not shown) of the data read circuit. Read data output from each of plurality of S/A circuits 5380 is supplied to an input/output (I/O) circuit (not shown) via a global line (not shown).

Referring to FIG. 13, memory device 6000 comprises cell arrays 6100 each comprising a plurality of memory cells 611, a plurality of row decoders 6200 that respectively select word lines for cell arrays 6100, and a plurality of column selection blocks 6300 that respectively select local bit lines for cell arrays 6100. Each of cell arrays 6100 comprises a first reference cell 621 that generates a first reference voltage VREFL and a second reference cell 622 that generates a second reference voltage VREFH.

Memory device 6000 further comprises a column decoder block 6400 that decodes a column address to generate a column selection signal. Column decoder block 6400 is arranged at a side to correspond to cell arrays 6100. The column selection signal output from column decoder block 6400 is globally transmitted to be commonly applied to at least two cell arrays 6100 from among cell arrays 6100. In some embodiments, S/A circuits 6480 are additionally arranged in column decoder block 6400.

In each of column selection blocks 6300, a local line LIO is arranged to locally transmit first and second reference voltages VREFL and VREFH. First and second reference voltages VREFL and VREFH output from first and second reference cells 621 and 622 are applied to column decoder block 6400 via local line LIO and a global line GIO. Specifically, first and second reference voltages VREFL and VREFH transmitted via global line GIO are applied to a clamping voltage generation unit 6470. A clamping voltage VCMP generated by clamping voltage generation unit 6470 is commonly applied to a gate of a clamping circuit (not shown) of a data read circuit.

Memory device 6000 has a structure in which S/A circuits 6480 are shared by cell arrays 6100. Thus, an area occupied by S/A circuits 6480 may be small. However, because a data voltage and reference voltages that have yet to be developed to a full digital level are transmitted via global line GIO, a voltage variation may occur due to a resistance component in global line GIO. Nevertheless, a data read circuit such as those described above is capable of reducing the influence of the voltage variation, thereby improving the reliability of read data.

Figure 14:
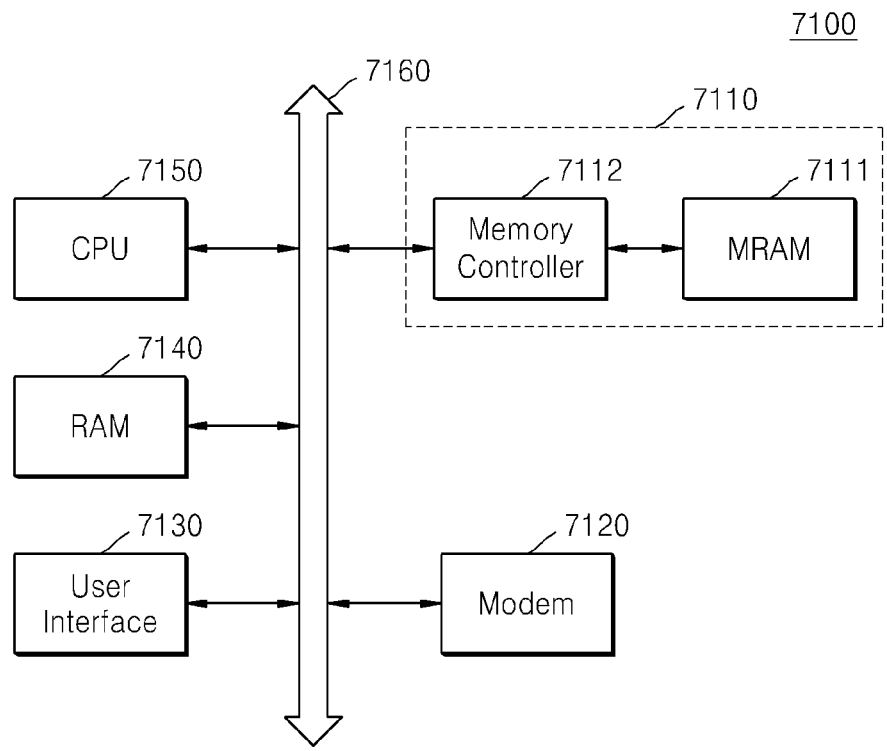
FIG. 14 is a block diagram of an information processing system comprising a memory device according to an embodiment of the inventive concept.

FIG. 14 is a block diagram of an information processing system 7100 comprising a nonvolatile memory device 7111 according to an embodiment of the inventive concept.

Referring to FIG. 14, nonvolatile memory device 7111 is installed in information processing system 7100, e.g., a mobile device or a desktop computer. Information processing system 7100 comprises a nonvolatile memory system 7110, a modem 7120, a central processing unit (CPU) 7150, a random access memory (RAM) 7140, and a user interface 7130 that are electrically connected via a system bus 7160.

Nonvolatile memory system 7110 comprises nonvolatile memory device 7111, e.g., an MRAM, and a memory controller 7112. Nonvolatile memory device 7111 stores data processed by CPU 7150 or data input from an external source. Nonvolatile memory device 7111 can take various forms in alternative embodiments, such as flash memory, MRAM, PRAM, RRAM, or FRAM, for example. At least one of nonvolatile memory device 7111 and RAM 7140 comprises a nonvolatile memory device as described above in relation to various embodiments. Although not shown in FIG. 14, information processing system 7100 may further comprise other features such as an application chipset, a camera image processor (CIS), or an I/O device, for example.

Figure 15:
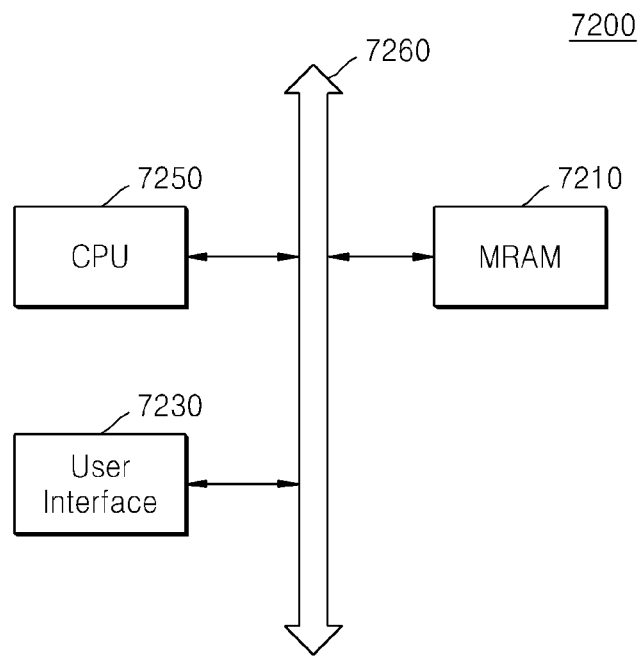
FIG. 15 is a block diagram of an information processing system comprising a memory device according to an embodiment of the inventive concept.

FIG. 15 is a block diagram of an information processing system 7200 comprising a nonvolatile memory device 7210 according to an embodiment of the inventive concept.

Referring to FIG. 15, nonvolatile memory device 7210 is installed in information processing system 7200, e.g., a mobile device or a desktop computer. Information processing system 7200 comprises nonvolatile memory device 7210, a CPU 7250, and a user interface 7230 that are electrically connected via a system bus 7260. Nonvolatile memory device 7210 of FIG. 15 may be embodied as a memory system that further comprises a memory controller (not shown).

An MRAM, which is an example of the above described nonvolatile memories, may be relatively inexpensive and have high memory capacity comparable to a DRAM or an SRAM. Consequently, certain MRAM devices as described above may be used in place of DRAM or SRAM in certain applications such as data caches or working memories. In addition, because MRAM provides nonvolatile data storage, it may facilitate improvements in these and other applications, for example by simplifying their operation.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device, comprising:
 a nonvolatile cell array comprising a memory cell and a reference cell;
 a clamping circuit electrically connected to the memory cell and configured to clamp a voltage applied to a data sensing line during a read operation; and
 a clamping voltage generation unit configured to generate a clamping voltage responsive to a first voltage having a level based on the reference cell, and to feed back the clamping voltage to the clamping circuit.

2. The nonvolatile memory device of claim 1, wherein the clamping circuit comprises a clamping transistor that receives the clamping voltage via a gate electrode, wherein the voltage applied to the data sensing line is adjusted by adjusting a turn-on state of the clamping transistor according to the clamping voltage.

3. The nonvolatile memory device of claim 1, wherein the memory cell comprises a magnetic random access memory (MRAM) cell and the clamping voltage varies according to a resistance value of the MRAM cell.

4. The nonvolatile memory device of claim 1, wherein the clamping voltage generation unit comprises an amplifier that compares the first voltage with a second voltage that is initially precharged to the data sensing line, and generates, as the clamping voltage, an amplified signal corresponding to a difference between the first and second voltages.

5. The nonvolatile memory device of claim 1, wherein the reference cell comprises:
 a first reference cell configured to store data of a first logic state and to generate a first reference voltage during the read operation; and
 a second reference cell configured to store data of a second logic state and to generate a second reference voltage during the read operation.

6. The nonvolatile memory device of claim 5, wherein the clamping voltage generation unit comprises a voltage divider comprising at least one resistor and configured to receive and divide the first and second reference voltages to generate the first voltage with a level corresponding to an average of the first and second reference voltages.

7. The nonvolatile memory device of claim 6, wherein the clamping voltage generation unit further comprises an amplifier configured to receive the first voltage and a second voltage which precharges the data sensing line, and further configured to generate an amplified signal with a level corresponding to a difference between the first and second voltages as the clamping voltage.

8. The nonvolatile memory device of claim 7, wherein the amplifier is configured to generate the clamping voltage to be relatively low where the first voltage is lower than the second voltage and to feed back the clamping voltage to the clamping circuit, and is further configured to generate the clamping voltage to be relatively high where the first voltage is higher than the second voltage and to feed back the clamping voltage to the clamping circuit.

9. The nonvolatile memory device of claim 6, further comprising a sense amplifier circuit that is electrically connected to the memory cell and is configured to generate read data by differentially amplifying the first voltage and a data voltage based on the memory cell.

10. The nonvolatile memory device of claim 5, further comprising a sense amplifier circuit electrically connected to the memory cell and configured to generate read data by differentially amplifying the first and second reference voltages and a data voltage based on the memory cell.

11. A data read circuit, comprising:
a memory cell read circuit comprising a first clamping circuit electrically connected to a memory cell and configured to clamp a data voltage applied to a data sensing line;
a reference cell read circuit comprising a second clamping circuit and a third clamping circuit electrically connected to a first reference cell and a second reference cell, respectively, the second and third clamping circuits configured to respectively clamp a first reference voltage applied to a first transfer line and a second reference voltage applied to a second transfer line; and
a clamping voltage generation unit configured to generate a clamping voltage to vary according to the first and second reference voltages,
wherein the clamping voltage is fed back to at least one of the first to third clamping circuits.

12. The data read circuit of claim 11, wherein the data sensing line and the first and second transfer lines are precharged to a precharge voltage during an initial stage of a read operation, and
the clamping voltage generation unit is configured to generate the clamping voltage by comparing a third reference voltage generated from the first and second reference voltages with the precharge voltage.

13. The data read circuit of claim 12, wherein the first reference cell stores data of a first logic state,
the second reference cell stores data of a second logic state, and
the third reference voltage corresponds to an average voltage of the first and second reference voltages.

14. The data read circuit of claim 12, wherein the clamping voltage generation unit comprises:
a voltage divider configured to generate the third reference voltage by dividing the first and second reference voltages; and
an amplifier configured to generate the clamping voltage by amplifying the difference between the third reference voltage and the precharge voltage.

15. A method of reading data from a nonvolatile memory device, comprising:
adjusting a clamping voltage based on a reference voltage generated by performing a read operation on a reference cell;
adjusting a data voltage of a data sensing line connected to a memory cell according to the clamping voltage; and
performing the read operation on the memory cell.

16. The method of claim 15, wherein the adjusting of the clamping voltage comprises:
generating a first reference voltage and a second reference voltage by performing the read operation on a first reference cell that stores data that is in a first logic state and a second reference cell that stores data that is in a second logic state;
generating the clamping voltage based on the first and second reference voltages;
feeding back the clamping voltage to a first clamping circuit and a second clamping circuit that are electrically connected to the first and second reference cells, respectively; and
changing the clamping voltage according to a change in the first and second reference voltages, when a clamping operation is performed.

17. The method of claim 16, wherein generating of the clamping voltage comprises:
generating a third reference voltage corresponding to an average of the first and second reference voltages; and
comparing the third reference voltage with a voltage that is initially precharged to a bit line, and generating, as the clamping voltage, an amplified signal corresponding to a voltage difference.

18. The method of claim 16, wherein, until the clamping voltage is stabilized, the feeding back of the clamping voltage and the changing of the clamping voltage are repeatedly performed.

19. The method of claim 18, further comprising sensing data by the data voltage and the first and second reference voltages, wherein the sensing of the data is performed after the clamping voltage is stabilized through the feeding back of the clamping voltage.

20. The method of claim 15, wherein first and second reference cells comprise magnetic random access memory (MRAM) cells and the clamping voltage varies according to respective resistance values of the MRAM cells.

* * * * *